United States Patent
Suzuki et al.

(10) Patent No.: US 9,301,399 B2
(45) Date of Patent: Mar. 29, 2016

(54) METHOD OF TREATING WIRING SUBSTRATE AND WIRING SUBSTRATE MANUFACTURED BY THE SAME

(71) Applicants: Mitsubishi Gas Chemical Company, Inc., Chiyoda-ku (JP); Ryoko Chemical Co., Ltd., Chiyoda-ku (JP)

(72) Inventors: Tomoko Suzuki, Tokyo (JP); Norihumi Tashiro, Kanagawa (JP); Yukihide Naito, Kanagawa (JP); Akari Hitotsugo, Kanagawa (JP)

(73) Assignees: MITSUBISHI GAS CHEMICAL COMPANY, INC., Chiyoda-Ku (JP); RYOKO CHEMICAL CO., LTD., Chiyoda-ku (JP)

( * ) Notice: Subject to any disclaimer, the term of this patent is extended or adjusted under 35 U.S.C. 154(b) by 103 days.

(21) Appl. No.: 14/256,252

(22) Filed: Apr. 18, 2014

(65) Prior Publication Data
US 2014/0311778 A1 Oct. 23, 2014

(30) Foreign Application Priority Data
Apr. 23, 2013 (JP) .................. 2013-090015

(51) Int. Cl.
| H05K 3/06 | (2006.01) |
| H05K 3/10 | (2006.01) |
| C23F 1/18 | (2006.01) |
| C23F 1/02 | (2006.01) |
| C23F 1/00 | (2006.01) |
| C23G 1/10 | (2006.01) |
| C23C 22/52 | (2006.01) |
| C23C 18/16 | (2006.01) |
| C09K 13/04 | (2006.01) |
| H01L 21/3213 | (2006.01) |
| H05K 3/38 | (2006.01) |

(52) U.S. Cl.
CPC ............. *H05K 3/108* (2013.01); *C09K 13/04* (2013.01); *C23C 18/1653* (2013.01); *C23C 22/52* (2013.01); *C23F 1/00* (2013.01); *C23F 1/02* (2013.01); *C23F 1/18* (2013.01); *C23G 1/103* (2013.01); *H01L 21/32134* (2013.01); *H05K 3/067* (2013.01); *H05K 3/383* (2013.01)

(58) Field of Classification Search
CPC ............. C23F 1/18; C23F 1/02; C23F 1/44; C23G 1/103; C23C 22/52; C23C 18/1653; C09K 13/04; C09K 13/06; H01L 2924/01029; H01L 2224/13147; H01L 21/32134; H01L 2224/05647; H05K 3/383; H05K 3/108
See application file for complete search history.

(56) References Cited

U.S. PATENT DOCUMENTS
6,254,758 B1 * 7/2001 Koyama .................. 205/187

FOREIGN PATENT DOCUMENTS
| JP | 6-330358 | 11/1994 |
| JP | 2006-009122 | 1/2006 |
| JP | 2009-120870 | 6/2009 |
| JP | 2009-221596 | 10/2009 |

* cited by examiner

Primary Examiner — Jiong-Ping Lu
(74) Attorney, Agent, or Firm — Oblon, McClelland, Maier & Neustadt, L.L.P.

(57) ABSTRACT

A method of treating a wiring substrate according to an embodiment includes, in a semi-additive process:
(1) contacting the wiring substrate with a pre-etching treatment liquid composition containing a chloride ion, the wiring substrate containing a seed layer formed of an electroless copper and a wiring pattern formed of an electrolytic copper; and
(2) continuously, etching the wiring substrate with an etching liquid composition containing a hydrogen peroxide, a sulfuric acid, a tetrazole, a chloride ion, a copper ion and a water.

14 Claims, 10 Drawing Sheets

FIG. 1

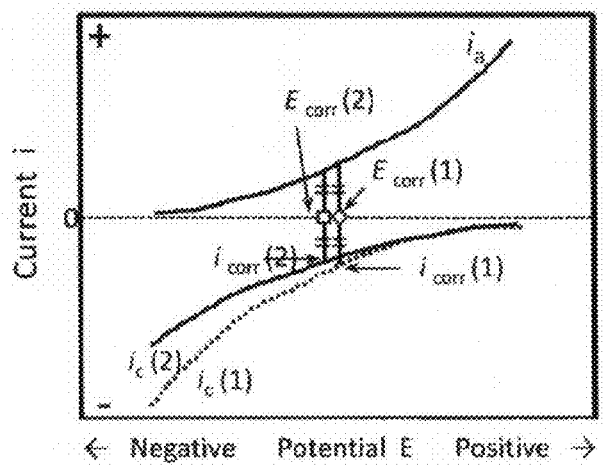

$i_a$: Internal anode current
$i_c(1)$: Internal cathode current
$i_c(2)$: Internal cathode current when cathode reaction is suppressed $i_{corr}(1)$: Corrosion current density representing corrosion rate by current
$i_{corr}(2)$: Corrosion current density representing corrosion rate by current when cathode reaction is suppressed $E_{corr}(1)$: Mixed potential
$E_{corr}(2)$: Mixed potential when cathode reaction is suppressed Contour diagram of etching rate (μm/min) of electroless copper with respect to immersion time duration (s) and chloride ion concentration (ppm)

Contour diagram of etching rate (μm/min) of electrolytic copper with respect to immersion time duration (s) and chloride ion concentration (ppm)

Contour diagram in which etching rate (μm/min) of electroless copper and etching rate (μm/min) of electrolytic copper overlap each other Contour diagram of etching rate (μm/min) of electroless copper with respect to immersion time duration (s) and chloride ion concentration (ppm)

Contour diagram of etching rate (μm/min) of electrolytic copper with respect to immersion time duration (s) and chloride ion concentration (ppm)

Seed layer (electroless copper) present

Seed layer (electroless copper) etched away

Seed layer (electroless copper) etched away

Seed layer (electroless copper) etched away

Seed layer (electroless copper) etched away

Seed layer (electroless copper) etched away

METHOD OF TREATING WIRING SUBSTRATE AND WIRING SUBSTRATE MANUFACTURED BY THE SAME

CROSS-REFERENCE TO RELATED APPLICATION

This application is based upon and claims the benefit of priority from the prior Japanese Patent Application No. 2013-090015, filed Apr. 23, 2013, the entire contents of which are incorporated herein by reference.

BACKGROUND OF THE INVENTION

1. Field of the Invention

The present invention relates to a method of treating a wiring substrate in a semi-additive process. Specifically, the present invention relates to a method of treating a wiring substrate, during manufacture of an IC package substrate, by pre-treating the wiring substrate with a pre-etching treatment liquid composition and then etching it with an etching liquid composition. The present invention also relates to a wiring substrate manufactured by the method above.

2. Description of Related Art

As an integration degree of IC (integrated circuit) is increased, a wiring rule of package substrate is now becoming increasingly finer. Along with this, a semi-additive process (hereinafter, may be referred to as the "SAP") has been widely used for manufacture of the package substrate. The SAP process is performed as follows. First, a seed layer is formed on a substrate formed of an insulating layer by electroless copper plating. Subsequently, a resist pattern is formed on the seed layer by photolithography. On an exposed part of the seed layer formed of an electroless copper, a copper wiring pattern is formed by electrolytic copper plating. After the wiring pattern is formed, the resist is removed (a space formed by the removal of the resist pattern is to act as an inter-circuit space). The seed layer formed of the electroless copper positioned below the removed resist pattern is removed by etching. Thus, a wiring substrate is manufactured. Currently, the SAP realizes manufacture of the wiring substrate having a line/space (hereinafter, may be referred to as the "L/S") as narrow as about 12 μm/13 μm. A finer wiring pattern is now demanded. However, it is difficult for a conventional etching process to fulfill the demand.

One disadvantage of the SAP is the following. When the electroless copper which forms the seed layer is etched away, the electrolytic copper which forms a wire is also etched away. Therefore, the wire formed of the electrolytic copper becomes thinner after the etching. For this reason, it is common that a pre-etching wiring pattern is formed in consideration of the amount which is to be etched away in a lateral direction thereof (hereinafter, the etching caused in the lateral direction of the wiring pattern will be referred to as a "side etching"). In a case where, for example, the amount of side etching caused when a wire having a post-etching L/S of 12 μm/13 μm is to be formed is 2 μm on one side, a pre-etching L/S of the wiring pattern is set to 16 μm/9 μm. In this manner, a wire having the post-etching L/S of 12 μm/13 μm can be formed. Now, it is assumed that the post-etching L/S is, for example, 6 μm/6 μm because of a requirement for a finer pattern. In this case, if the amount of side etching is 2 μm on each side as described above, the wiring pattern having the pre-etching L/S of 10 μm/2 μm needs to be set. When a width of space, namely, an area to be exposed to light is small, a light scattering is caused inside the resist and a light-exposed area of the resist is expanded. This makes it difficult to form the resist pattern. Even if the resist pattern is formed by adjusting a thickness of the resist or an exposure condition, a width of the resist pattern remaining after a development is small. This causes the resist, for example, to be delaminated or inclined during the development or washing. This makes it difficult to form the wires in a later step.

As described above, for forming an intended fine wiring pattern by the SAP, specifically for forming the resist pattern in accordance with a desired wiring rule, there is a limit on decreasing the width of a part of the resist that is to be exposed to light. Accordingly, it is strongly desired that in the step of etching the electroless copper which forms the seed layer, the amount of side etching of the electrolytic copper, which is to form the wires, is decreased significantly as compared with the amount caused by the conventional method.

As a method of suppressing the amount of side etching, it has been discussed to decrease a thickness of the seed layer so that the amount of etching of the seed layer and the wiring pattern is decreased. However, when the thickness of the seed layer is decreased, there occurs another problem that, for example, it is difficult to uniformize the thickness of the seed layer, and as a result, the wires themselves cannot be formed. Therefore, there is a limit on decreasing the thickness of the electroless copper plating which forms the seed layer. Currently, the thickness of the seed layer is 1 to 2 μm. In addition, a part of the seed layer that is to be the space needs to be removed completely. For this reason, the seed layer is commonly etched under a condition called "over-etching", under which the etching time duration is made longer than is theoretically necessary to etch away a seed layer having a certain thickness or an etching liquid composition which realizes etching at a high rate is used.

It is now assumed that, for example, the thickness of the seed layer is 1 μm on average and the etching liquid composition and etching conditions by which the seed layer is etched away by 1 μm per minute are used. In this case, when over-etching of 100%, etching is performed for 2 minutes. Namely, when the thickness of the seed layer is 1 μm and the over-etching is 100%, the seed layer is actually etched away by 2 μm. Therefore, in the case where the electroless copper and the electrolytic copper are etched at the same rate, even if the thickness of the seed layer formed of the electroless copper is decreased, there is a limit on suppressing the amount of side etching.

Under such circumstances, an etching liquid having a high ratio of an etching rate of the electroless copper (ERN) to an etching rate of the electrolytic copper (ERE) (hereinafter, referred to as the "selection ratio ERN/ERE") has been conventionally demanded. For example, Japanese Laid-Open Patent Publication No. (hereinafter referred to as JP-A-) 2009-221596 proposes an etching liquid containing a cupric ion source as a main component. JP-A-H6-330358 proposes an aqueous solution of ammonium persulfate.

JP-A-2009-120870 proposes an aqueous solution containing hydrogen peroxide-sulfuric acid as a main component. When copper is dissolved in this solution, reduction of hydrogen peroxide (a cathode reaction) occurs as well as the dissolution of copper (an anode reaction) as represented by expressions (1) and (2).

Anode reaction: $Cu \rightarrow Cu^{2+} + 2e^-$ (1)

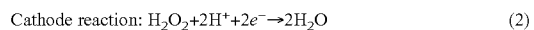

Cathode reaction: $H_2O_2 + 2H^+ + 2e^- \rightarrow 2H_2O$ (2)

JP-A-2009-120870 discloses that the etching rate can be controlled by promoting the anode reaction and the cathode reaction, in other words, by changing a concentration of an acid that dissolves copper ions or a concentration of hydrogen peroxide that supplies electrons.

JP-A-2006-9122 includes an example in which an azole such as a tetrazole, a triazole or the like is added to the etching liquid in order to adjust the etching rate of copper to a preferable level. JP-A-2006-9122 describes that since the azole is adsorbed to a surface of copper, which is an anode, the anode reaction represented by the above expression (1) is suppressed, and as a result, the etching rate is decreased.

BRIEF SUMMARY OF THE INVENTION

However, when an aqueous solution of copper (II) chloride or an aqueous solution of iron (II) chloride described in JP-A-2009-221596 is used as the etching liquid, the etching rate is too high and thus it is difficult to control the side etching of the copper used for the wires. When an aqueous solution of sodium persulfate described in JP-A-H6-330358 is used as the etching liquid, the etching rate is low and a selection ratio is low, and thus the side etching of a fine wiring pattern cannot be suppressed sufficiently.

The method described in JP-A-2009-120870 cannot significantly improve the selection ratio of the electroless copper to the electrolytic copper, and thus cannot decrease the amount of side etching.

The method described in JP-A-2006-9122 decreases the etching rate of electroless copper as well as the etching rate of electrolytic copper because the adsorption property of the azole to the anode also acts on a surface of electroless copper. This merely results in extending an etching time duration required to remove the seed layer (electroless copper), and the side etching of the wiring pattern (electrolytic copper) cannot be easily suppressed.

The present inventors made a search for a method of increasing the ratio of the etching rate of electroless copper to the etching rate of electrolytic copper, namely, ERN/ERE, by performing electrochemical measurement (mixed potential measurement) between the etching liquid composition and the electroless copper and between the etching liquid composition and the electrolytic copper. In addition, the present inventors made investigations on various multiple stage treating methods in an attempt to increase the selection ratio at the time of etching. Embodiments of the invention have an object of providing a method of treating the wiring substrate capable of suppressing side etching of the wiring pattern (electrolytic copper) and a high density wiring substrate manufactured by such a method.

Some aspects according to the present invention are as follows.

[1] A method of treating a wiring substrate in a semi-additive process, the method comprising:
(1) contacting the wiring substrate with a pre-etching treatment liquid composition containing (a) a chloride ion and (b) a water, the wiring substrate containing a seed layer formed of an electroless copper and a wiring pattern formed of an electrolytic copper; and
(2) continuously, etching the wiring substrate with an etching liquid composition containing (c) a hydrogen peroxide, (d) a sulfuric acid, (e) a tetrazole, (f) a chloride ion, (g) a copper ion and (h) a water.

[2] The method according to [1], wherein a washing step and/or a drying step are not included between the step (1) and the step (2).

[3] The method according to [1] or [2], wherein the (a) chloride ion is contained in the pre-etching treatment liquid composition at a concentration of 1 to 10 ppm.

[4] The method according to any one of [1] to [3], wherein the (a) chloride ion is generated from at least one compound selected from sodium chloride, ammonium chloride, potassium chloride and hydrochloric acid.

[5] The method according to any one of [1] to [4], wherein in the step (2) in which the wiring substrate is treated with the etching liquid composition, a ratio (ERN/ERE) of an etching rate of the electroless copper (ERN) to an etching rate of the electrolytic copper (ERE) is 2.1 or higher.

[5-1] The method according to [5], wherein in the step (2) in which the wiring substrate is treated with the etching liquid composition, a ratio (ERN/ERE) of an etching rate of the electroless copper (ERN) to an etching rate of the electrolytic copper (ERE) is 2.1 to 50.

[6] The method according to any one of [1] to [5], wherein a difference between a mixed potential of the electroless copper which forms the seed layer and a mixed potential of the electrolytic copper which forms the wiring pattern is 10 mV or greater.

[6-1] The method according to [6], wherein a difference between a mixed potential of the electroless copper which forms the seed layer and a mixed potential of the electrolytic copper which forms the wiring pattern is 10 to 200 mV.

[7] The method according to any of [1] to [6-1], wherein the (e) tetrazole is at least one compound selected from 1-methyltetrazole, 5-ethyl-1-methyltetrazole, 1-ethyl-5-methyltetrazole, 1,5-diethyltetrazole, 1-isopropyl-5-methyltetrazole, and 1,5-dimethyltetrazole.

[8] A method of treating a wiring substrate in a semi-additive process, comprising:
(1) contacting the wiring substrate with a pre-etching treatment liquid composition containing (i) a chloride ion, (j) a sulfuric acid and (k) a water, the wiring substrate containing a seed layer formed of an electroless copper and a wiring pattern formed of an electrolytic copper; and
(2) continuously, etching the wiring substrate with an etching liquid composition containing (l) a hydrogen peroxide, (m) a sulfuric acid, (n) a tetrazole, (p) a chloride ion, (q) a copper ion and (r) a water.

[9] The method according to [8], wherein a washing step and/or a drying step are not included between the step (1) and the step (2).

[10] The method according to [8] or [9], wherein in the pre-etching treatment liquid composition, the (i) chloride ion is contained at a concentration of 0.01 to 3 ppm and the (m) sulfuric acid is contained at a concentration of 1 to 20% by mass.

[11] The method according to any one of [8] to [10], wherein the (i) chloride ion is generated from at least one compound selected from sodium chloride, ammonium chloride, potassium chloride and hydrochloric acid.

[12] The method according to any one of [8] to [11], wherein in the step (2) in which the wiring substrate is treated with the etching liquid composition, a ratio (ERN/ERE) of an etching rate of the electroless copper (ERN) to an etching rate of the electrolytic copper (ERE) is 2.1 or higher.

[12-1] The method according to [12], wherein in the step (2) in which the wiring substrate is treated with the etching liquid composition, a ratio (ERN/ERE) of an etching rate of the electroless copper (ERN) to an etching rate of the electrolytic copper (ERE) is 2.1 to 50.

[13] The method according to any one of [8] to [12], wherein a difference between a mixed potential of the electroless copper which forms the seed layer and a mixed potential of the electrolytic copper which forms the wiring pattern is 10 mV or greater.

[13-1] The method according to [13], wherein a difference between a mixed potential of the electroless copper which forms the seed layer and a mixed potential of the electrolytic copper which forms the wiring pattern is 10 to 200 mV.
[14] The method according to any one of [8] to [13-1], wherein the (n) tetrazole is at least one compound selected from 1-methyltetrazole, 5-ethyl-1-methyltetrazole, 1-ethyl-5-methyltetrazole, 1,5-diethyltetrazole, 1-isopropyl-5-methyltetrazole, and 1,5-dimethyltetrazole.
[14-1] The method according to any one of [1] to [14], wherein the (e) or (n) tetrazole is contained in the etching liquid composition at a concentration of 0.001 to 0.1% by mass.
[14-2] The method according to any one of [1] to [14-1], wherein the (c) or (l) hydrogen peroxide is contained in the etching liquid composition at a concentration of 0.1 to 10% by mass.
[14-3] The method according to any one of [1] to [14-2], wherein the (d) or (m) sulfuric acid is contained in the etching liquid composition at a concentration of 0.1 to 20% by mass.
[14-4] The method according to any one of [1] to [14-3], wherein the (f) or (i) chloride ion is contained in the etching liquid composition at a concentration of 0.1 to 10 ppm.
[15] A method of manufacturing a wiring substrate, comprising the method of treating the wiring substrate according to any one of [1] to [7].
[16] A method of manufacturing a wiring substrate, comprising the method of treating the wiring substrate according to any one of [8] to [14].
[17] A wiring substrate manufactured by the method according to [15].
[18] A wiring substrate manufactured by the method according to [16].

BRIEF DESCRIPTION OF THE SEVERAL VIEWS OF THE DRAWINGS

FIG. 1 schematically shows a relationship between an internal anode current $i_a$ or an internal cathode current $i_c$ and a potential E.

DETAILED DESCRIPTION OF THE INVENTION

Figure 2:
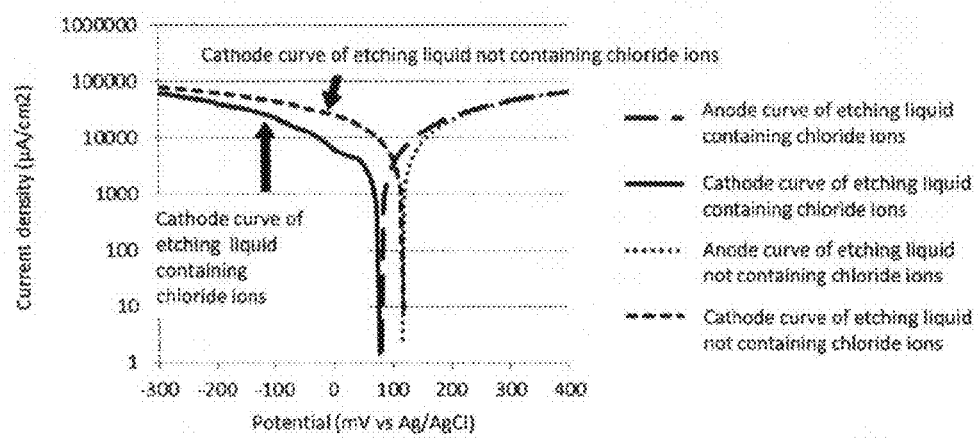
FIG. 2 shows polarization curves representing an electrochemical reaction between the etching liquid composition and electrolytic copper in the case where no pre-etching treatment liquid composition is used.

According to a method of treating a wiring substrate in an embodiment, the wiring substrate is treated with a specific pre-etching treatment liquid composition and then treated with an etching liquid composition. In this manner, the potential of a surface of electroless copper and a potential of a surface of electrolytic copper can be changed while the difference therebetween is kept constant. Thus, the etching rate of the electroless copper and the etching rate of the electrolytic copper can be controlled.

First Embodiment

The method of treating the wiring substrate in the first embodiment includes, in a semi-additive process:
(1) contacting the wiring substrate with the pre-etching treatment liquid composition containing (a) a chloride ion and (b) a water, the wiring substrate containing a seed layer formed of an electroless copper and a wiring pattern formed of an electrolytic copper; and
(2) continuously, etching the wiring substrate with the etching liquid composition containing (c) a hydrogen peroxide, (d) a sulfuric acid, (e) a tetrazole, (f) a chloride ion, (g) a copper ion and (h) a water.

In the first embodiment, the chloride ions are indispensable in the pre-etching treatment liquid composition (in the case where sulfuric acid is absent). Preferable compounds which generate chloride ions include hydrochloric acid, sodium chloride, potassium chloride, and ammonium chloride. Hydrochloric acid is especially preferable.

The chloride ions are contained in the pre-etching treatment liquid composition at a concentration of 1 to 10 ppm, preferably 1 to 9 ppm, more preferably 2 to 8 ppm, and especially preferably 3 to 7 ppm. When the concentration of the chloride ions is in the range of 1 to 10 ppm, the etching rate of the electroless copper and the electrolytic copper can be controlled to be preferable levels.

Second Embodiment

Also usable as a pre-etching treatment liquid composition is a composition in which a washing water containing sulfuric acid, used in a sulfuric acid washing step which is commonly performed before etching in order to remove an oxide layer from a surface of electrolytic copper, coexists with chloride ions.

A method of treating a wiring substrate in the second embodiment includes, in a semi-additive process:

(1) contacting the wiring substrate with a pre-etching treatment liquid composition containing (i) a chloride ion, (j) a sulfuric acid and (k) a water, the wiring substrate containing a seed layer formed of an electroless copper and a wiring pattern formed of an electrolytic copper; and (2) continuously, etching the wiring substrate with an etching liquid composition containing (l) a hydrogen peroxide, (m) a sulfuric acid, (n) a tetrazole, (p) a chloride ion, (q) a copper ion and (r) a water.

Preferable compounds which generate chloride ions for the pre-etching treatment liquid composition include hydrochloric acid, sodium chloride, potassium chloride, and ammonium chloride. Hydrochloric acid and sodium chloride are especially preferable.

The sulfuric acid is contained in the pre-etching treatment liquid composition at a concentration of 1 to 20%, by mass, preferably 2 to 15% by mass, and especially preferably 3 to 10% by mass.

The chloride ions are contained in the sulfuric acid-containing pre-etching treatment liquid composition at a concentration of 0.01 to 3 ppm, preferably 0.05 to 2 ppm, and especially preferably 0.1 to 1 ppm. When the concentration of the chloride ions is in the range of 0.01 to 3 ppm, the etching rate of the electroless copper and the electrolytic copper can be controlled to be preferable levels.

Hereinafter, the first embodiment and the second embodiment will be described together.

In the step (1), the pre-etching treatment liquid composition is used, and thus the chloride ions in the treating liquid composition are adsorbed to the surface of the electrolytic copper. Therefore, during the etching performed in the step (2), the potential of the electrolytic copper can be kept at a certain value from the start of the etching (see FIG. 5 and FIG. 6).

As a result of the step (1) and the step (2), the etching rate of the electroless copper (seed layer) and the etching rate of the electrolytic copper (copper for wires) can be made different from each other. Thus, the method according to the embodiment provides a desired effect.

According to a conventional method, the treatment with the pre-etching treatment liquid composition is not performed. With such a conventional method, even if chloride ions are contained in the etching liquid, electrolytic copper, which is to form the wires, is increasingly etched before the chloride ions are sufficiently adsorbed to the electrolytic copper. Therefore, the effect of suppressing side etching is insufficient (see FIG. 4).

In addition, in order to prevent desorption of the adsorbed chloride ions, it is important to perform etching after the pre-etching treatment step without performing any other treatment for removing the chloride ions such as washing with water or the like. Therefore, according to the embodiment, it is preferable that a water-washing and/or drying step are not included between the step (1) and the step (2).

In the etching liquid composition used in the step (2), the (c) and (i) hydrogen peroxide is contained at a concentration of 0.1 to 10% by mass, preferably 0.3 to 7% by mass, and especially preferably 0.5 to 5% by mass. When the concentration of the hydrogen peroxide is 0.1 to 10% by mass, the etching rates can be kept at preferable levels.

In the etching liquid composition, the (d) and (m) sulfuric acid is contained at a concentration of 0.1 to 20% by mass, preferably 0.5 to 15% by mass, and especially preferably 1 to 10% by mass. When the concentration of the sulfuric acid is 0.1 to 20% by mass, the etching rates can be kept at preferable levels.

The (e) and (n) tetrazole, when contained in the etching liquid composition together with the chloride ions, provides an effect of further decreasing the etching rate of the electrolytic copper.

Preferable tetrazoles include 1-methyltetrazole, 5-ethyl-1-methyltetrazole, 1-ethyl-5-methyltetrazole, 1,5-diethyltetrazole, 1-isopropyl-5-methyltetrazole, and 1,5-dimethyltetrazole. 1,5-dimethyltetrazole is especially preferable.

In the etching liquid composition, the (e) and (n) tetrazole is contained at a concentration of 0.001 to 0.1% by mass, preferably 0.005 to 0.05% by mass, and especially preferably 0.008 to 0.03% by mass. When the concentration of the tetrazole is 0.001 to 0.1% by mass, the amount of side etching can be suppressed small.

In the etching liquid composition, the (f) and (i) chloride ions are contained at a concentration of 0.1 to 10 ppm, preferably 0.2 to 8 ppm, and especially preferably 0.3 to 7 ppm. When the concentration of the chloride ions is 0.1 to 10 ppm, the amount of side etching can be suppressed small.

In the etching liquid composition, the (g) and (q) copper ions are contained at a concentration of 0.1 to 20% by mass, preferably 0.5 to 18% by mass, and especially preferably 1 to 15% by mass. When the concentration of the copper ions is 0.1 to 20% by mass, the etching can be performed stably.

Preferable compounds which generate copper ions to be added to the etching liquid composition include, in addition to copper, copper sulfate, copper nitrate, copper acetate, copper hydroxide, copper (II) chloride, copper (II) bromide, copper (II) fluoride, copper (II) iodide, ammonium copper sulfate, and a hydrate thereof. Copper sulfate and copper nitrate are especially preferable. During the etching, copper ions are generated also from dissolved electrolyte copper and electroless copper. Continuous etching can be performed in the same bath by keeping the total amount of the copper ions added above and/or the amount of the dissolved copper ions in a preferable range.

As the (b) and (k) water in the pre-etching treatment liquid composition and the (h) and (r) water in the etching liquid composition, diluted water, ion exchange water, ultrapure water or the like is usable. Ultrapure water is especially preferable. The concentration of the water is the residual other than the above-described components.

In the above, the concentration of each component is represented as a value based on the pre-etching treatment liquid composition or the etching liquid composition.

The chloride ions are adsorbed to, and desorbed from, the electrolytic copper in repetition and thus keeps the etching rate of the electrolytic copper during the etching at a low level. As a result of repeating the etching, the concentration of the chloride ions is decreased, which gradually increases the etching rate and thus increases the amount of side etching.

Therefore, it is necessary to appropriately adjust the concentration of each component. Such adjustment can be performed by any common method.

Hereinafter, each of steps of the method of treating the wiring substrate according to the embodiments will be described in detail.

The method of treating the wiring substrate according to the embodiments includes the step (1) of contacting the wiring substrate with the pre-etching treatment liquid composition containing chloride ions. The wiring substrate contains the seed layer formed of the electroless copper and the wiring pattern formed of the electrolytic copper.

The etching by using an acidic etching liquid composition containing hydrogen peroxide is dominated by a cathode reaction. Therefore, in order to decrease the etching rate of the electrolytic copper, the cathode reaction (reduction of hydrogen peroxide) on a surface of the electrolytic copper needs to be suppressed. FIG. 1 schematically shows a relationship between an internal anode current $i_a$ or an internal cathode current $i_c$ with a potential E. At a mixed potential $E_{corr}$, a current i=0, but the anode reaction and the cathode reaction progress at the rate of $i_a=|i_c|=i_{corr}$. In the case where the cathode reaction is dominant, when the cathode reaction is suppressed, the internal cathode current $i_c$ is decreased from $i_c(1)$ to $i_c(2)$. The corrosion current density $i_{corr}$, which represents the corrosion rate by a current, is decreased from $i_{corr}(1)$ to $i_{corr}(2)$. The suppression in the cathode reaction changes the mixed potential $E_{corr}$ from $E_{corr}(1)$ to $E_{corr}(2)$, namely, lowers the mixed potential $E_{corr}$. Accordingly, the etching rate can be lowered by setting such etching conditions that lower the mixed potential of the electrolytic copper.

First, each element of the embodiments and functions thereof will be described by way of results of electrochemical measurement performed on the electrolytic copper and the electroless copper which are contacted with the etching liquid composition.

FIG. 2 shows polarization curves representing an electrochemical reaction between the etching liquid composition and the electrolytic copper in the case where no pre-etching treatment liquid composition is used. Herein, the etching liquid composition containing hydrogen peroxide, sulfuric acid, a tetrazole, copper ions and chloride ions was used, and an etching liquid not containing chloride ions was used as a comparative example. For performing the measurement to obtain the polarization curves, HZ-5000 manufactured by Hokuto Denko Corporation was used. As the potentiostat system, a three-electrode system including a copper working electrode, a platinum counter electrode and a Luggin probe-salt bridge Ag/AgCl reference electrode was used. The measurement was performed in a sweep range of −400 mV to 400 mV with respect to the mixed potential at a sweep rate of 1 mV/sec.

As can be seen from FIG. 2, when chloride ions are contained, the current density is decreased as the cathode reaction of the electrolytic copper progresses.

Figure 3:
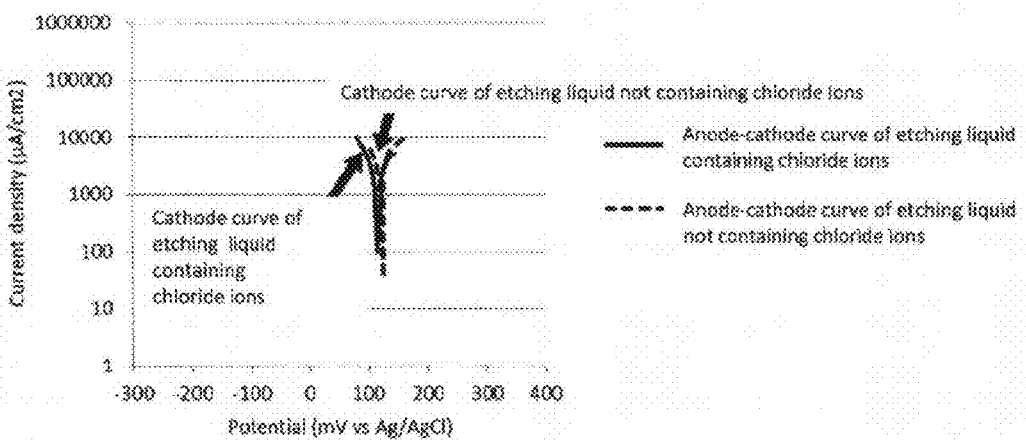
FIG. 3 shows polarization curves representing the electrochemical reaction between the etching liquid composition and electroless copper in the case where no pre-etching treatment liquid composition is used.

FIG. 3 shows polarization curves representing an electrochemical reaction between the etching liquid composition and the electroless copper in the case where no pre-etching treatment liquid composition is used. Herein, the etching liquid composition containing hydrogen peroxide, sulfuric acid, a tetrazole, copper ions and chloride ions was used (solid line), and an etching liquid not containing chloride ions was used as a comparative example (dashed line). The measurement was performed in substantially the same manner as described above except that the measurement was performed from the potential lower by 20 mV than the mixed potential until dissolution occurred at a sweep rate of 1 mV/sec.

As can be seen from FIG. 3, as the cathode reaction of the electroless copper progresses, the current density is changed in generally the same manner regardless of whether chloride ions are contained or not.

As can be seen from FIG. 2 and FIG. 3, the chloride ions contained in the etching liquid composition especially decreases the etching rate of electrolytic copper. This is considered to occur because chloride ions have a cathode adsorption property to a surface of the electrolytic copper and thus suppresses the cathode reaction. By contrast, chloride ions have almost no cathode adsorption property to the electroless copper, unlike to the electrolytic copper, and therefore are expected to hardly decrease the etching rate of the electroless copper. The presence of chloride ions in the etching liquid composition can decrease the etching rate of electrolytic copper while maintaining the etching rate of electroless copper, and as a result, can suppress the side etching of the electrolytic copper which is to form the wires.

Figure 4:
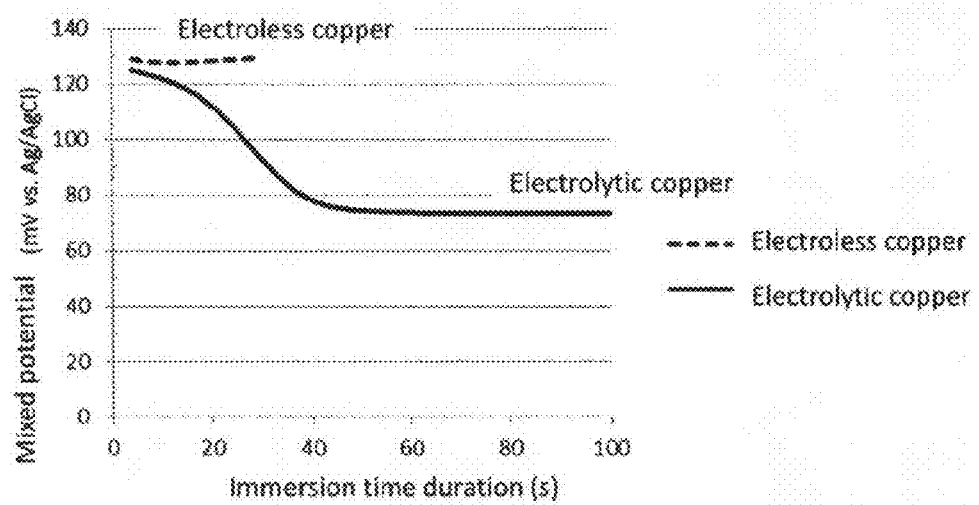
FIG. 4 shows a change, in accordance with time, in the mixed potential of each of electroless copper and electrolytic copper in the case where no pre-etching treatment liquid composition is used.

The electrolytic copper and the electroless copper were immersed in the etching liquid composition without using any pre-etching treatment liquid composition. FIG. 4 shows a change in the mixed potential of each of the electrolytic copper and the electroless copper in accordance with the immersion time duration. Herein, the etching liquid composition containing hydrogen peroxide, sulfuric acid, a tetrazole, copper ions and chloride ions was used.

As can be seen from the measurement results on the mixed potentials shown in FIG. 4, it requires a time duration of about 40 seconds until the cathode adsorption of the chloride ions to a surface of the electrolytic copper occurs in the etching liquid and after the adsorption occurs, the potential is stable (the potential difference is about 50 mV). Namely, during this time duration (about 40 seconds), etching on the electrolytic copper progresses and the side etching of the copper which is to form the wires progresses.

Figure 5:
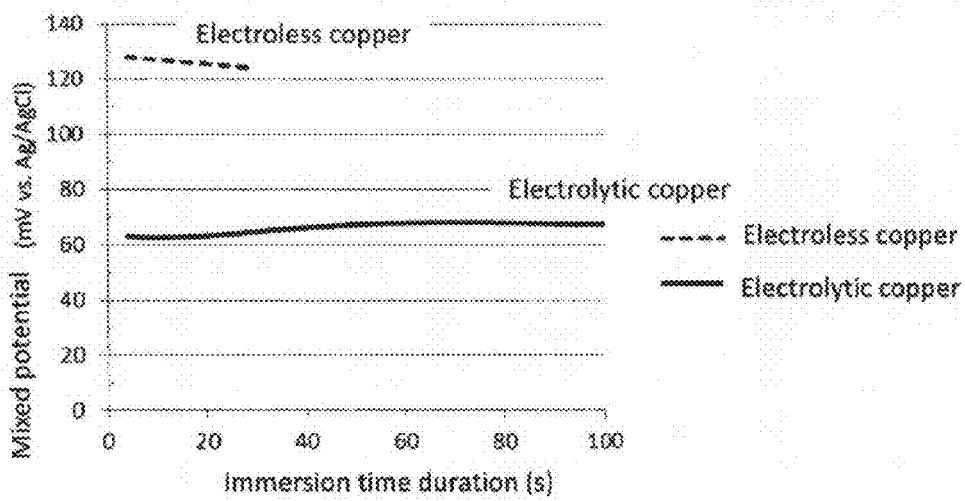
FIG. 5 shows a change, in accordance with time, in the mixed potential of each of electroless copper and electrolytic copper in the case where a pre-etching treatment liquid composition in a first embodiment is used.
Figure 6:
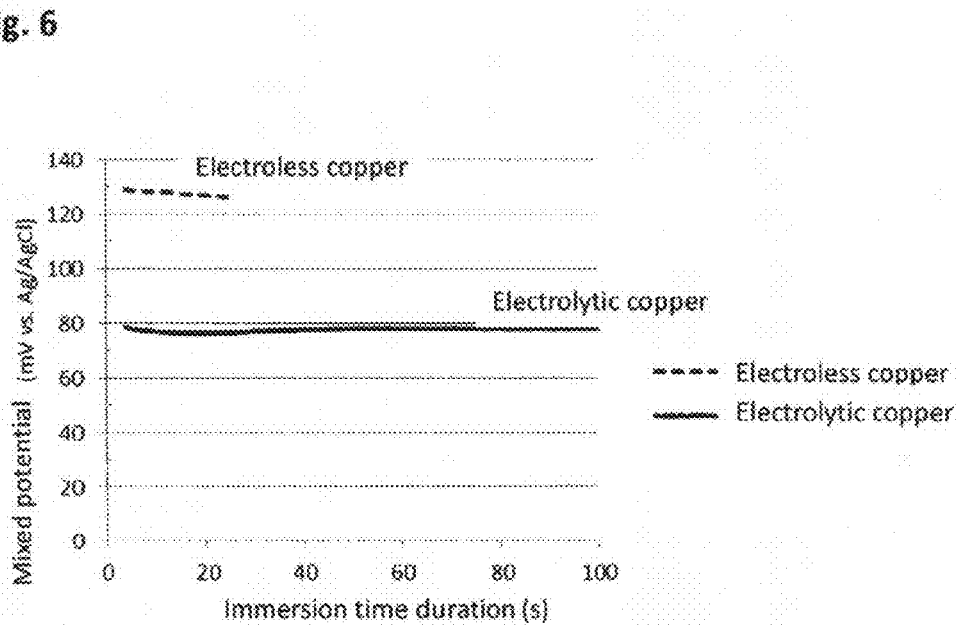
FIG. 6 shows a change, in accordance with time, in the mixed potential of each of electroless copper and electrolytic copper in the case where the pre-etching treatment liquid composition in a second embodiment is used.

The electroless copper and the electrolytic copper were immersed in the pre-etching treatment liquid composition, and then immersed in the etching liquid composition. FIG. 5 and FIG. 6 each show the results of measurement of the mixed potential performed in substantially the same manner as described above.

FIG. 5 shows the results obtained in the case where a liquid containing chloride ions and water (specifically, an aqueous solution of hydrochloric acid) was used as the pre-etching treatment liquid composition for the step (1), and a liquid containing hydrogen peroxide, sulfuric acid, a tetrazole, copper ions and chloride ions was used as the etching liquid composition for the step (2).

FIG. 6 shows the results obtained in the case where a liquid containing chloride ions (specifically, sodium chloride) and sulfuric acid was used as the pre-etching treatment liquid composition for the step (1), and a liquid containing hydrogen peroxide, sulfuric acid, a tetrazole, copper ions and chloride ions was used as the etching liquid composition for the step (2).

As can be seen from the results shown in FIG. 5 and FIG. 6, in the case where the pre-etching treatment liquid composition for the step (1) is used, the chloride ions in the pre-etching treatment liquid composition provide the surface of the electrolytic copper with a cathode reaction suppression effect. This effect allows the potential difference between the electroless copper and the electrolytic copper to be increased (by 50 to 70 mV) from that in the initial state (immersion time duration: zero). As a result, the etching rate of the electrolytic copper is decreased, and thus the side etching can be suppressed.

The mixed potential difference between the electroless copper which forms the seed layer and the electrolytic copper which forms the wiring pattern is preferably 10 mV or greater, more preferably 10 to 200 mV, still more preferably 15 to 200 mV, and especially preferably 20 to 200 mV. When the mixed potential difference between the electroless copper and the electrolytic copper is 10 mV or greater, the etching rate of the electroless copper can be kept while the etching rate of the electrolytic copper can be decreased. Therefore, the side etching does not progress.

In the first embodiment, the pre-etching treatment liquid composition for the step (1) contains chloride ions as a first indispensable component. The concentration of the chloride ions in the pre-etching treatment liquid composition varies in accordance with the time duration in which the electrolytic copper and the electroless copper are in contract with the pre-etching treatment liquid composition (see FIG. 7, FIG. 8 and FIG. 9).

Figure 7:
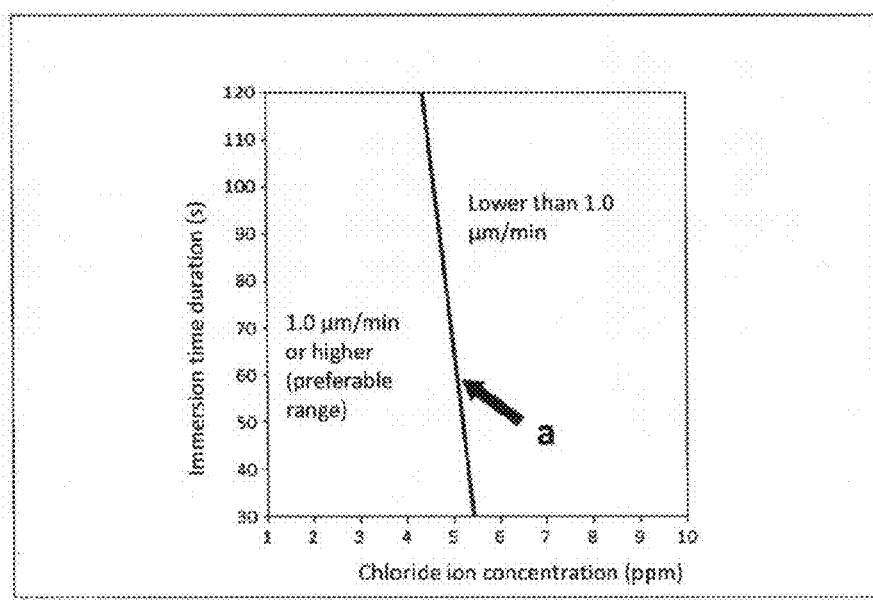
FIG. 7 is a contour diagram showing the etching rate of electroless copper in the case where the pre-etching treatment liquid composition in the first embodiment is used.

The electroless copper was immersed in the pre-etching treatment liquid composition of the first embodiment while the chloride ion concentration (factor 1) and the immersion time duration (factor 2) were changed, and then was etched with the etching liquid composition. FIG. 7 shows the etching rate in this case by a contour. In FIG. 7, x axis represents the chloride ion concentration in the pre-etching treatment liquid composition, and y axis represents the time duration in which the electroless copper was immersed in the pre-etching treatment liquid composition.

Solid line a is a contour obtained in the case where the etching rate of regression expression (1) below is 1.0 μm/min. In the case where the seed layer has an average thickness of 1 μm, it is desirable to finish etching within 1 minute, and to further completely remove the electroless copper by etching within 1 minute and 30 seconds (50% over-etching). When the etching takes longer, the productivity is low. Thus, it is not common to use an etching liquid providing a low etching rate. Therefore, the required etching rate of electroless copper is 1.0 μm/min. or higher.

The etching rate was calculated as follows. Before the pre-etching treatment step, the mass of the substrate having the electroless copper stacked thereon was measured. After the pre-etching treatment step as the step (1) was performed and then the etching step as the step (2) was performed, the mass of the substrate was measured. The etching rate was calculated based on the difference between the mass before the pre-etching treatment step and the mass after the etching step. Herein, the etching liquid containing 1.4% by mass of hydrogen peroxide, 4.2% by mass of sulfuric acid, 0.01% by mass of 1,5-dimethyltetrazole (1,5-dMTZ), 1 ppm of chloride ions (sodium chloride was used), 25 g/L of copper ions (copper sulfate pentahydrate was used) and water (remaining part) was used.

The etching rate of the electroless copper (μm/min)= 2.7530+(−0.4052×chloride ion concentration (ppm))+(−0.0028×immersion time duration (s))+ (0.0181×chloride ion concentration (ppm)×chloride ion concentration (ppm))    regression expression (1)

Figure 8:
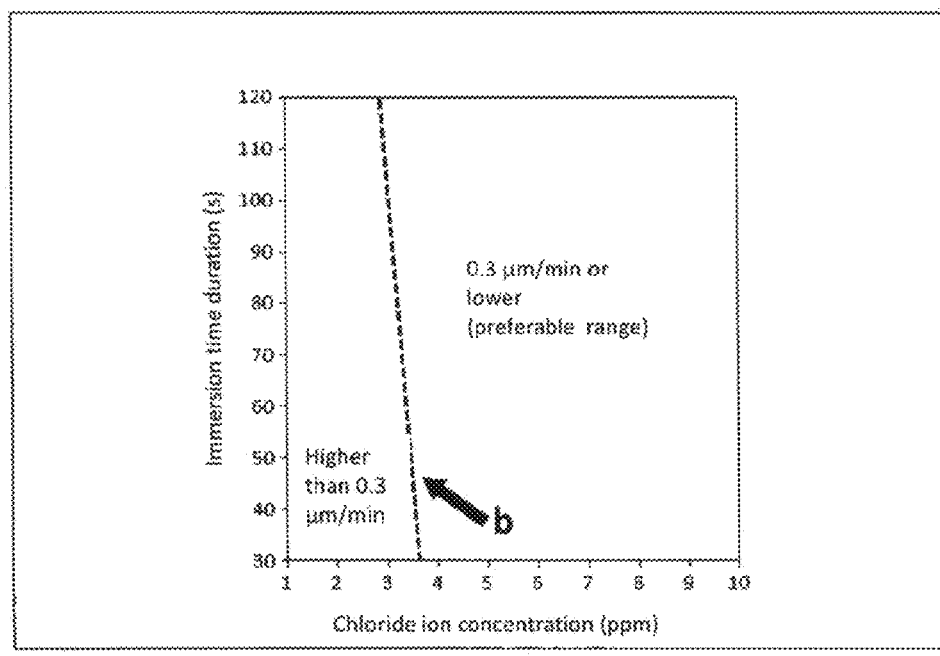
FIG. 8 is a contour diagram showing the etching rate of electrolytic copper in the case where the pre-etching treatment liquid composition in the first embodiment is used.

The electrolytic copper was immersed in the pre-etching treatment liquid composition of the second embodiment while the chloride ion concentration (factor 1) and the immersion time duration (factor 2) were changed, and then was etched with the etching liquid composition. FIG. 8 shows the etching rate in this case by a contour.

In FIG. 8, x axis represents the chloride ion concentration in the pre-etching treatment liquid composition, and y axis represents the time duration in which the electrolytic copper was immersed in the pre-etching treatment liquid composition.

Dashed line b is a contour obtained in the case where the etching rate of regression expression (2) below is 0.3 μm/min. In the case where the L/S of the wiring pattern is 6 μm/6 μm, the permissible amount of side etching of the circuit pattern is 0.5 μm on one side. Therefore, the required etching rate of electrolytic copper is 0.3 μm/min. or lower.

The etching rate was calculated as follows. Before the pre-etching treatment step, the mass of the substrate having electrolytic copper stacked thereon was measured. After the pre-etching treatment step as the step (1) was performed and then the etching step as the step (2) was performed, the mass of the substrate was measured. The etching rate was calculated based on the difference between the mass before the pre-etching treatment step and the mass after the etching step. Herein, the etching liquid containing 1.4% by mass of hydrogen peroxide, 4.2% by mass of sulfuric acid, 0.01% by mass of 1,5-dimethyltetrazole (1,5-dMTZ), 1 ppm of chloride ions (sodium chloride was used), 25 g/L of copper ions (copper sulfate pentahydrate was used) and water (remaining part) was used.

The etching rate of the electrolytic copper (μm/min)= 0.5568+(−0.0868×chloride ion concentration (ppm))+(−0.0004×immersion time duration (s))+ (0.0055×chloride ion concentration (ppm)×chloride ion concentration (ppm))    regression expression (2)

Figure 9:
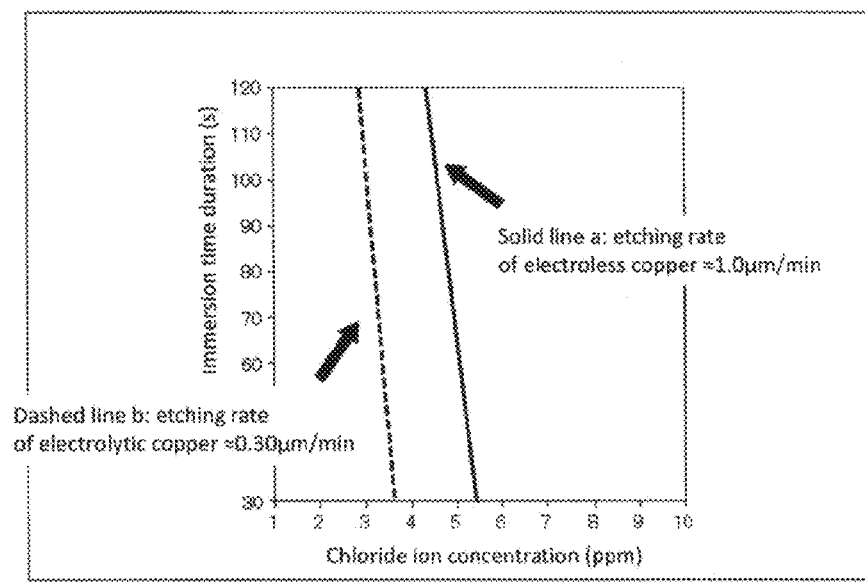
FIG. 9 is a contour diagram in which FIG. 7 and FIG. 8 overlap each other.

FIG. 9 is a contour diagram in which the results shown in FIG. 7 and FIG. 8 overlap each other. A part sandwiched between solid line a and dashed line b in FIG. 9 is an area in which the chloride ion concentration in the pre-etching treatment liquid composition and the immersion time duration are both preferable.

A wire formation step performed by use of the semi-additive process generally includes a step of removing copper oxide with an aqueous solution of sulfuric acid in order to remove a metallic copper before etching is performed. The treatment with the pre-etching treatment liquid composition in the first embodiment is usable as a substitute of a water-washing step performed after the treatment with the aqueous solution of sulfuric acid. The number of steps is not increased.

In the second embodiment, the pre-etching treatment liquid composition contains chloride ions as a first indispensable component. The concentration of the chloride ions in the pre-etching treatment liquid composition varies in accordance with the time duration in which the electrolytic copper and the electroless copper are in contract with the pre-etching treatment liquid composition. This will be described with reference to FIG. 10, FIG. 11 and FIG. 12.

Figure 10:
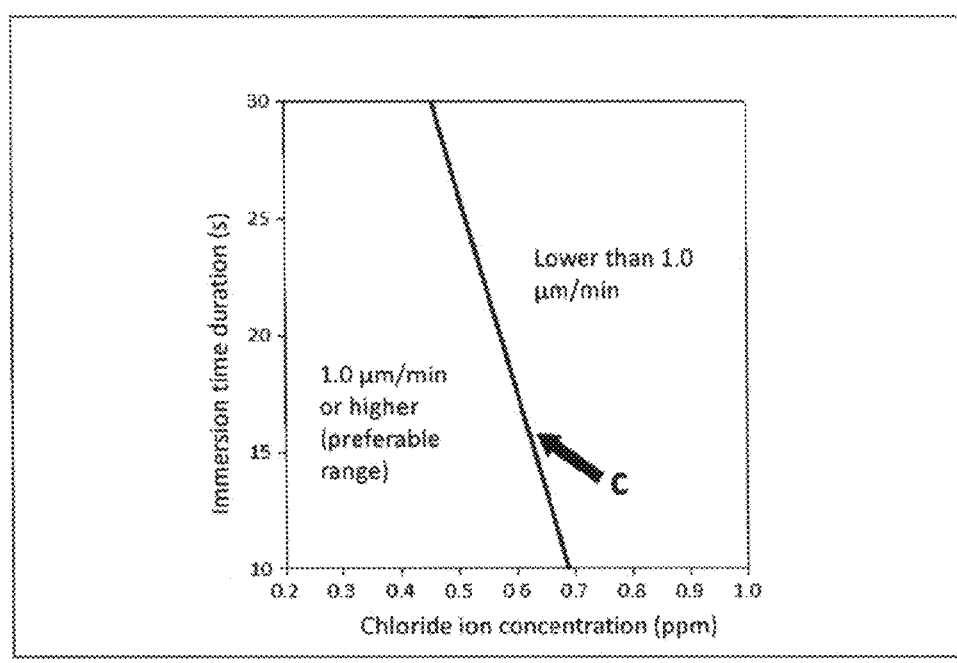
FIG. 10 is a contour diagram showing the etching rate of electroless copper in the case where the pre-etching treatment liquid composition in the second embodiment is used.

The electroless copper was immersed in the pre-etching treatment liquid composition of the second embodiment while the chloride ion concentration (factor 1) and the immersion time duration (factor 2) were changed, and then was etched with the etching liquid composition. FIG. 10 shows the etching rate in this case by a contour.

In FIG. 10, x axis represents the chloride ion concentration in the pre-etching treatment liquid composition, and y axis represents the time duration in which the electroless copper was immersed in the pre-etching treatment liquid composition.

In FIG. 10, solid line c is a contour obtained in the case where the etching rate of regression expression (3) below is 1.0 μm/min. Herein, the etching liquid composition containing 1.4% by mass of hydrogen peroxide, 4.2% by mass of sulfuric acid, 0.01% by mass of 1,5-dimethyltetrazole (1,5-dMTZ), 1 ppm of chloride ions (sodium chloride was used), 25 g/L of copper ions (copper sulfate pentahydrate was used) and water (remaining part) was used.

The etching rate of the electroless copper (μm/min)= 4.2218+(−7.0811×chloride ion concentration (ppm))+(−0.0412×immersion time duration (s))+ (3.9167×chloride ion concentration (ppm)×chloride ion concentration (ppm))+(0.0303×chloride ions concentration (ppm)×immersion time duration (s))    regression expression (3)

Figure 11:
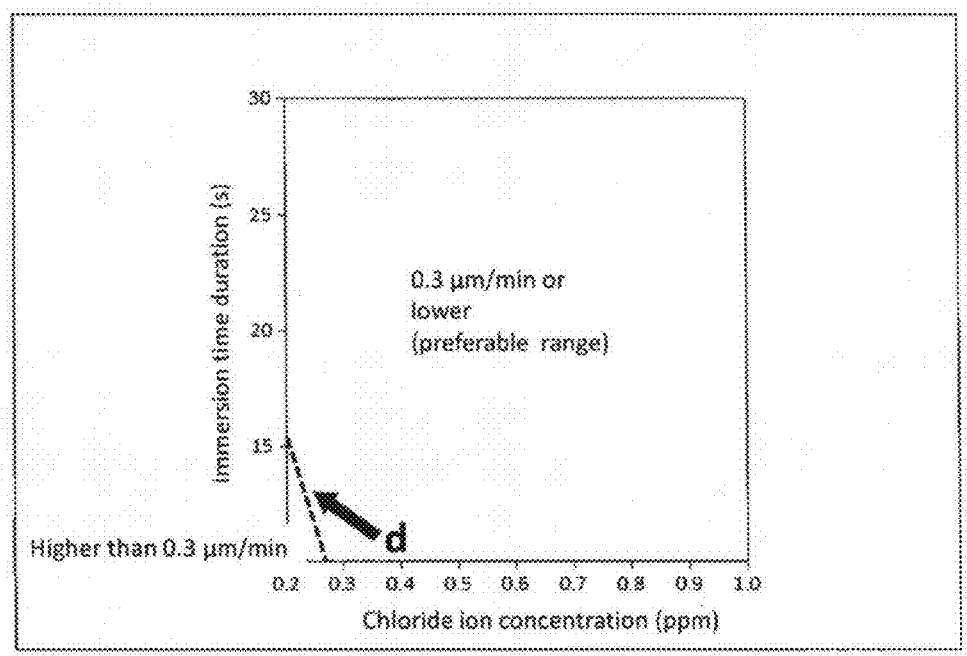
FIG. 11 is a contour diagram showing the etching rate of electrolytic copper in the case where the pre-etching treatment liquid composition in the second embodiment is used.

The electrolytic copper was immersed in the pre-etching treatment liquid composition of the second embodiment while the chloride ion concentration (factor 1) and the immersion time duration (factor 2) were changed, and then was etched with the etching liquid composition. FIG. 11 shows the etching rate in this case by a contour.

In FIG. 11, x axis represents the chloride ion concentration in the pre-etching treatment liquid composition, and y axis represents the time duration in which the electrolytic copper was immersed in the pre-etching treatment liquid composition.

In FIG. 11, dashed line d is a contour obtained in the case where the etching rate of regression expression (4) below is 0.3 µm/min. Herein, the etching liquid containing 1.4% by mass of hydrogen peroxide, 4.2% by mass of sulfuric acid, 0.01% by mass of 1,5-dimethyltetrazole, 1 ppm of chloride ions (sodium chloride was used), 25 g/L of copper ions (copper sulfate pentahydrate was used) and water (remaining part) was used.

The etching rate of the electrolytic copper (µm/min)= 0.3989+(−0.3278×chloride ion concentration (ppm))+(−0.0032×immersion time duration (s))+ (0.1704×chloride ion concentration (ppm)×chloride ion concentration (ppm))+(0.0034×chloride ion concentration (ppm)×immersion time duration (s))   regression expression (4)

Figure 12:
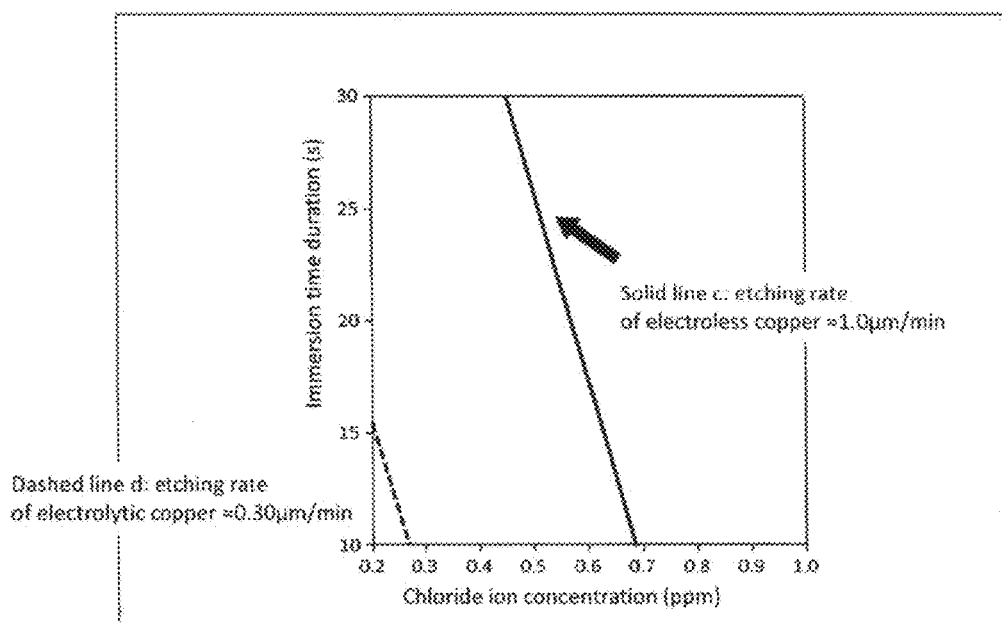
FIG. 12 is a contour diagram in which FIG. 10 and FIG. 11 overlap each other.

FIG. 12 is a contour diagram in which the results shown in FIG. 10 and FIG. 11 overlap each other. A part sandwiched between solid line c and dashed line d in FIG. 12 is an area in which the chloride ion concentration in the pre-etching treatment liquid composition and the immersion time duration are both preferable.

As described above, a wire formation step performed by use of the semi-additive process generally includes a step of removing copper oxide with an aqueous solution of sulfuric acid in order to remove metallic copper before etching is performed. The pre-etching treatment liquid composition of the second embodiment is usable as a substitute of the aqueous solution of sulfuric acid used in the step of removing copper oxide. Therefore, the number of steps is not increased.

In order to suppress the amount of side etching of electrolytic copper, it is preferable that the ratio of the etching rate of electroless copper (ERN) to the etching rate of electrolytic copper (ERE), namely, ERN/ERE, is higher. In the above-described embodiments, in the step (2) in which the wiring substrate is treated with the etching liquid composition, the ratio of the etching rate of the electroless copper (ERN) to the etching rate of the electrolytic copper (ERE), namely, ERN/ERE, can be made 2.1 or higher, in the range of 2.1 to 50, in the range of 2.5 to 40, or in the range of 3.0 to 30.

The method by which the wiring substrate is put into contact with the pre-etching treatment liquid composition used in the step (1) and the etching liquid composition used in the step (2) may be an immersion method, a spray method, or any other common method.

The temperature at which the wiring substrate contacts the pre-etching treatment liquid composition used in the step (1) and the etching liquid composition used in the step (2) is 0° C. to 80° C., preferably 10° C. to 70° C., and more preferably 15° C. to 60° C. When the temperature exceeds 80° C., the decomposition of hydrogen peroxide may progress. When the temperature is lower than 0° C., the etching rate may be extremely low.

The time duration in which the wiring substrate contacts the pre-etching treatment liquid composition used in the step (1) and the etching liquid composition used in the step (2) is usually 0.1 seconds to 1000 seconds, preferably 1 second to 500 seconds, and more preferably 2 seconds to 180 seconds.

Namely, the above-described conditions may be appropriately determined in accordance with the compositions of the pre-etching treatment liquid composition used in the step (1) and the etching liquid composition used in the step (2), the environmental temperature and the like.

In another embodiment of the present invention, a method of manufacturing a wiring substrate including the method of treating a wiring substrate according to the first embodiment or the second embodiment is provided.

In further embodiment, a wiring substrate manufactured by the method of manufacturing the wiring substrate above is provided.

EXAMPLES

Hereinafter, the present invention will be described specifically by way of examples. The present invention is not to be interpreted as being limited to the following examples.
<Reagents Used in Examples and Comparative Examples>
Hydrogen peroxide: 60%; produced by Mitsubishi Gas Chemical Co., Inc.
Sulfuric acid: Guaranteed reagent produced by Wako Pure Chemical Industries, Ltd. was diluted to 46% by mass with pure water for use.
1,5-dimethyltetrazole (1,5-dMTZ): Reagent produced by Masuda Chemical Industries Co., Ltd.
Hydrochloric acid: Guaranteed reagent produced by Wako Pure Chemical Industries, Ltd.
Sodium chloride: Guaranteed reagent produced by Wako Pure Chemical Industries, Ltd.
Copper sulfate pentahydrate: Guaranteed reagent produced by Wako Pure Chemical Industries, Ltd.
<Measurement Method>
1. Mixed Potential:
The mixed potential was measured by a two-electrode method by use of an electrochemical measurement device (HZ-5000 (trademark) manufactured by Hokuto Denko Corporation). The electroless copper and the electrolytic copper were each used for a working electrode, and a Luggin probe salt bridge-connected silver/silver chloride electrode (HX-RAg (trademark) manufactured by Hokuto Denko Corporation) was used as a reference electrode. The measurement was performed by a fixed electrode method.
2. Polarization Curve
The polarization was measured by a three-electrode method by use of the electrochemical measurement device (HZ-5000 (trademark) manufactured by Hokuto Denko Corporation). The electroless copper and the electrolytic copper were each used for a working electrode, platinum was used for a counter electrode, and a Luggin probe salt bridge-connected silver/silver chloride electrode (HX-RAg (trademark) manufactured by Hokuto Denko Corporation) was used as a reference electrode. The measurement was performed by a fixed electrode method.
3. SEM Observation
Observation was performed by use of a scanning electron microscope (SEM: 53400 (trademark) manufactured by Hitachi High-Technologies Corporation) at an acceleration voltage of 10 kV and a magnitude of 6000×.

Measurement Example 1

In the Case where the Treatment with the Pre-Etching Treatment Liquid Composition is Performed A pre-etching treatment liquid composition (A1 liquid) and an etching liquid composition (B1 liquid) shown in Table 1 were prepared. The A1 liquid was prepared by adding 4.5 g of 0.01% aqueous solution of hydrochloric acid (chloride ions: 4.5 ppm) to 95.5 g of ultrapure water so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 1 is the ratio by mass of each component with respect to the total mass of the pre-etching treatment liquid composition or the etching liquid composition.

A substrate including a resin and only electroless copper stacked on a surface of the resin (hereinafter, also referred to as the "substrate having only electroless copper stacked thereon") and a substrate including a resin and only electrolytic copper stacked on a surface of the resin (hereinafter, also referred to as the "substrate having only electrolytic copper stacked thereon") were each immersed in a 5% aqueous solution of sulfuric acid for 30 seconds to remove copper oxide from a surface of the copper. Then, the two substrates were each immersed in the A1 liquid (pre-etching treatment liquid composition) at 25° C. for 30 seconds instead of being subjected to a water-washing step. Continuously, etching was performed as follows with the B1 liquid (etching liquid composition) set to 30° C. The substrate having only the electroless copper stacked thereon was immersed in the B1 liquid for 10 seconds, and the substrate having only the electrolytic copper stacked thereon was immersed in the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm$^2$)÷density of copper (8.94 g/cm$^3$)

The resultant etching amount was divided by the treating time duration to calculate the etching rate. The etching rate of the electroless copper (ERN) was 1.21 μm/min., whereas the etching rate of the electrolytic copper (ERE) was 0.16 μm/min. The etching rate ratio of the electroless copper to the electrolytic copper was 7.6.

A substrate having only the electroless copper stacked thereon as a result of being immersed in a 5% aqueous solution of sulfuric acid for 30 seconds to have copper oxide removed from the surface of the copper, and a substrate having only the electrolytic copper stacked thereon as a result of being immersed in a 5% aqueous solution of sulfuric acid for 30 seconds to have copper oxide removed from the surface of the copper, were each immersed in the A1 liquid (pre-etching treatment liquid composition) for 30 seconds. Then, the mixed potential of each substrate in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper at the start of the measurement was 130 mV (vs. Ag/AgCl), whereas the mixed potential of the electrolytic copper at the start of the measurement was 60 mV (vs. Ag/AgCl). The mixed potential difference was 70 mV.

Measurement Example 2

In the Case where the Treatment with the Pre-Etching Treatment Liquid Composition is Performed A pre-etching treatment liquid composition (A2 liquid) and the etching liquid composition (B1 liquid) shown in Table 1 were prepared. The A2 liquid was prepared by adding 0.2 g of 0.0165% aqueous solution of sodium chloride (chloride ions: 0.2 ppm) to 99.8 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 1 is the ratio by mass of each component with respect to the total mass of the pre-etching treatment liquid composition or the etching liquid composition.

A substrate including a resin and only electroless copper stacked on a surface of the resin, and a substrate including a resin and only electrolytic copper stacked on a surface of the resin, were each immersed in the A2 liquid (pre-etching treatment liquid composition) for 30 seconds. Continuously, etching was performed as follows by use of a spray etching machine with the B1 liquid (etching liquid composition) set to have a spray pressure of 0.1 MPa and a treating temperature of 30° C. The substrate having only the electroless copper stacked thereon was treated with the B1 liquid for 10 seconds, and the substrate having only the electrolytic copper stacked thereon was treated with the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm$^2$)÷density of copper (8.94 g/cm$^3$)

The resultant etching amount was divided by the treating time duration to calculate the etching rate.

The etching rate of the electroless copper was 1.91 μm/min., whereas the etching rate of the electrolytic copper was 0.26 μm/min. The etching rate ratio of the electroless copper to the electrolytic copper was 7.3.

A substrate having only the electroless copper stacked thereon and a substrate having only the electrolytic copper stacked thereon were each immersed in the A2 liquid (pre-etching treatment liquid composition) for 30 seconds. Continuously, the mixed potential of each substrate in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper at the start of the measurement was 130 mV (vs. Ag/AgCl), whereas the mixed potential of the electrolytic copper at the start of the measurement was 80 mV (vs. Ag/AgCl). The mixed potential difference was 50 mV.

Measurement Example 3

In the Case where the Treatment with the Pre-Etching Treatment Liquid Composition is Performed A pre-etching treatment liquid composition (A3 liquid) and the etching liquid composition (B1 liquid) shown in Table 1 were prepared. The A3 liquid was prepared by adding 0.1 g of 0.0165% aqueous solution of sodium chloride (chloride ions: 0.1 ppm) to 99.9 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 1 is the ratio by mass of each component with respect to the total mass of the pre-etching treatment liquid composition or the etching liquid composition.

A substrate including a resin and only electroless copper stacked on a surface of the resin, and a substrate including a resin and only electrolytic copper stacked on a surface of the resin, were each immersed in the A3 liquid (pre-etching treatment liquid composition) for 60 seconds. Continuously, etching was performed as follows by use of a spray etching machine with the B1 liquid (etching liquid composition) set to have a spray pressure of 0.1 MPa and a treating temperature of 30° C. The substrate having only the electroless copper stacked thereon was treated with the B1 liquid for 10 seconds, and the substrate having only the electrolytic copper stacked thereon was treated with the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm$^2$)÷density of copper (8.94 g/cm$^3$)

The resultant etching amount was divided by the treating time duration to calculate the etching rate.

The etching rate of the electroless copper (ERN) was 1.26 μm/min., whereas the etching rate of the electrolytic copper (ERE) was 0.19 μm/min. The etching rate ratio of the electroless copper to the electrolytic copper was 6.6.

A substrate having only the electroless copper stacked thereon and a substrate having only the electrolytic copper stacked thereon were each immersed in the A3 liquid (pre-etching treatment liquid composition) for 60 seconds. Then, the mixed potential of each substrate in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper at the start of the measurement was 130 mV (vs. Ag/AgCl), whereas the mixed potential of the electrolytic copper at the start of the measurement was 70 mV (vs. Ag/AgCl). The mixed potential difference was 60 mV.

Measurement Example 4

In the Case where the Treatment with the Pre-Etching Treatment Liquid Composition is Performed A pre-etching treatment liquid composition (A4 liquid) and the etching liquid composition (B1 liquid) shown in Table 1 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 1 is the ratio by mass of each component with respect to the total mass of the pre-etching treatment liquid composition or the etching liquid composition.

A substrate including a resin and only electroless copper stacked on a surface of the resin, and a substrate including a resin and only electrolytic copper stacked on a surface of the resin, were each immersed in the A4 liquid (pre-etching treatment liquid composition) for 10 seconds. Continuously, etching was performed as follows by use of a spray etching machine with the B1 liquid (etching liquid composition) set to have a spray pressure of 0.1 MPa and a treating temperature of 30° C. The substrate having only the electroless copper stacked thereon was treated with the B1 liquid for 10 seconds, and the substrate having only the electrolytic copper stacked thereon was treated with the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm$^2$)÷density of copper (8.94 g/cm$^3$)

The resultant etching amount was divided by the treating time duration to calculate the etching rate. The etching rate of the electroless copper (ERN) was 1.40 μm/min., whereas the etching rate of the electrolytic copper (ERE) was 0.26 μm/min. The etching rate ratio of the electroless copper to the electrolytic copper was 5.4.

A substrate having only the electroless copper stacked thereon and a substrate having only the electrolytic copper stacked thereon were each immersed in the A4 liquid (pre-etching treatment liquid composition) for 10 seconds. Continuously, the mixed potential of each substrate in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper was 130 mV (vs. Ag/AgCl), whereas the mixed potential of the electrolytic copper was 70 mV (vs. Ag/AgCl). The mixed potential difference was 60 mV.

Example 1

A pre-etching treatment liquid composition (A5 liquid) and the etching liquid composition (B1 liquid) shown in Table 2 were prepared. The A5 liquid was prepared by adding 4.0 g of 0.01% aqueous solution of hydrochloric acid (chloride ions: 4 ppm) to 96.0 g of ultrapure water so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 2 is the ratio by mass of each component with respect to the total mass of the pre-etching treatment liquid composition or the etching liquid composition.

On a surface of a resin, a seed layer having an average thickness of 1.0 μm (maximum thickness: 1.2 μm; minimum thickness: 0.7 μm) was formed by electroless copper plating. Then, a wiring pattern having a thickness of 12 μm and a line/space of 6.0 μm/6.0 μm was formed by electrolytic plating. Thus, a stacking substrate was obtained. The obtained stacking substrate was immersed in a 5% aqueous solution of sulfuric acid for 30 seconds to remove copper oxide from a surface of the copper. Then, the stacking substrate was immersed in the pre-etching treatment liquid composition (A5 liquid) at 25° C. for 90 seconds, and then the etching liquid composition (B1 liquid) was sprayed to the stacking substrate by use of a spray etching machine at a spray pressure of 0.1 MPa and a treating temperature of 30° C. for a time duration 1.5 times the time duration required to eliminate the seed layer (60 seconds) (namely, the etching liquid composition was sprayed for 90 seconds) (over-etching of 50%).

Figure 13A:
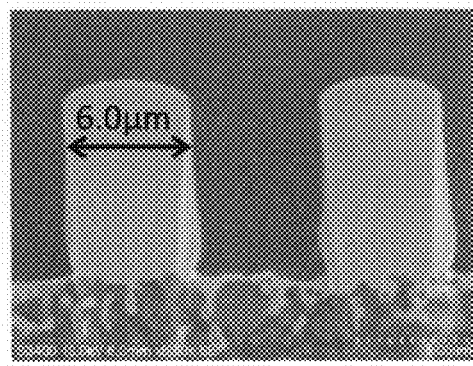
FIG. 13A shows an SEM image of a pre-etching wiring pattern (Example 1).

Side etching was evaluated by use of the scanning electron microscope (SEM: S3400 (trademark) manufactured by Hitachi High-Technologies Corporation). FIG. 13A shows pre-etching states of the electroless copper (1 μm) and the electrolytic copper (6 μm).

Figure 13B:
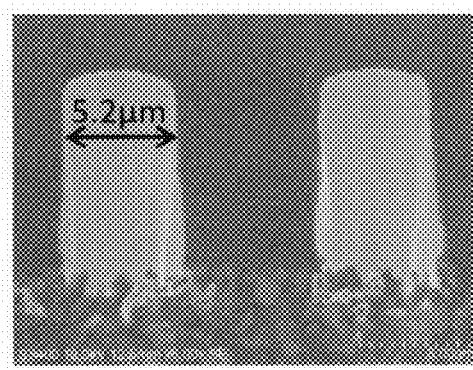
FIG. 13B shows an SEM image of a post-etching wiring pattern (Example 1).

FIG. 13B shows post-etching states of the electroless copper (1 μm) and the electrolytic copper (6 μm). After the etching, the electroless copper completely disappeared, and the electrolytic copper kept a width of 5.2 μm.

Namely, use of the pre-etching treatment liquid composition described above can suppress the side etching of the electrolytic copper. The amount of side etching continued for a time duration 1.5 times the time duration required to eliminate the seed layer (60 seconds) (namely, side etching continued for 90 seconds) was 0.40 μm on one side.

Example 2

The pre-etching treatment liquid composition (A4 liquid) and the etching liquid composition (B1 liquid) shown in Table 2 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 2 is the ratio by mass of each component with respect to the total mass of the pre-etching treatment liquid composition or the etching liquid composition.

On a surface of a resin, a seed layer having an average thickness of 1.0 μm (maximum thickness: 1.2 μm; minimum thickness: 0.7 μm) was formed by electroless copper plating. Then, a wiring pattern having a thickness of 12 μm and a line/space of 6.0 μm/6.0 μm was formed by electrolytic plating. Thus, a stacking substrate was obtained. The obtained stacking substrate was immersed in the pre-etching treatment liquid composition at 25° C. for 20 seconds. Continuously, the etching liquid was sprayed to the stacking substrate by use of a spray etching machine at a spray pressure of 0.1 MPa and a treating temperature of 30° C. for a time duration 1.5 times the time duration required to eliminate the seed layer (60 seconds) (namely, the etching liquid was sprayed for 90 seconds). Side etching was evaluated by use of the scanning electron microscope (SEM: S3400 (trademark) manufactured by Hitachi High-Technologies Corporation).

Figure 14:
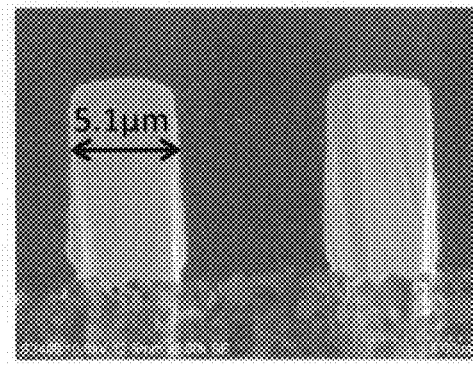
FIG. 14 shows an SEM image of a post-etching wiring pattern (Example 2).

FIG. 14 shows post-etching states of the electroless copper (1 μm) and the electrolytic copper (6 μm). After the etching, the electroless copper completely disappeared, and the electrolytic copper kept a width of 5.1 μm.

Namely, use of the pre-etching treatment liquid composition described above can suppress the side etching of the electrolytic copper. The amount of side etching continued for a time duration 1.5 times the time duration required to eliminate the seed layer (60 seconds) (namely, side etching continued for 90 seconds) was 0.45 μm on one side.

Measurement Example 5

In the Case where the Treatment with the Pre-Etching Treatment Liquid Composition is not Performed The etching liquid composition (B1 liquid) shown in Table 3 was prepared. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 3 is the ratio by mass of each component with respect to the total mass of the etching liquid composition.

A substrate including a resin and only electroless copper stacked on a surface of the resin, and a substrate including a resin and only electrolytic copper stacked on a surface of the resin, were each immersed in a 5% aqueous solution of sulfuric acid for 30 seconds to remove copper oxide from a surface of the copper, and then was washed with water. Continuously, etching was performed as follows with the B1 liquid (etching liquid composition) set to 30° C. The substrate having only the electroless copper stacked thereon was immersed in the B1 liquid for 10 seconds, and the substrate having only the electrolytic copper stacked thereon was immersed in the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm²)÷density of copper (8.94 g/cm³)

The resultant etching amount was divided by the treating time duration to calculate the etching rate.

The etching rate of the electroless copper was 1.98 μm/min., whereas the etching rate of the electrolytic copper was 1.0 μm/min. The etching rate ratio of the electroless copper to the electrolytic copper was 2.0.

The mixed potential of each of a substrate having only the electroless copper stacked thereon and a substrate having only the electrolytic copper stacked thereon in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper was 130 mV (vs. Ag/AgCl), whereas the mixed potential of the electrolytic copper was 125 mV (vs. Ag/AgCl). The mixed potential difference was 5 mV.

Measurement Example 6

In the Case where after the Treatment with the Pre-Etching Treatment Liquid Composition, Washing with Water is Performed The pre-etching treatment liquid composition (A4 liquid) and the etching liquid composition (B1 liquid) shown in Table 3 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 1 is the ratio by mass of each component with respect to the total mass of the pre-etching treatment liquid composition or the etching liquid composition.

A substrate including a resin and only electroless copper stacked on a surface of the resin, and a substrate including a resin and only electrolytic copper stacked on a surface of the resin, were each immersed in the A4 liquid (pre-etching treatment liquid composition) for 20 seconds, and then washed with water and dried. Etching was performed as follows with the B1 liquid (etching liquid composition) set to 30° C. The substrate having only the electroless copper stacked thereon was immersed in the B1 liquid for 10 seconds, and the substrate having only the electrolytic copper stacked thereon was immersed in the B1 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm²)÷density of copper (8.94 g/cm³)

The resultant etching amount was divided by the treating time duration to calculate the etching rate. The etching rate of the electroless copper was 2.12 μm/min., whereas the etching rate of the electrolytic copper was 1.14 μm/min. The etching rate ratio of the electroless copper to the electrolytic copper was 1.9.

A substrate having only the electroless copper stacked thereon and a substrate having only the electrolytic copper stacked thereon were each immersed in the A4 liquid (pre-etching treatment liquid composition) for 20 seconds, and then washed with water and dried. The mixed potential of each substrate in the B1 liquid (etching liquid composition) was measured by the electrochemical measurement device. Based on the mixed potential of each of the electroless copper and the electrolytic copper at the start of the measurement, the mixed potential difference was calculated by the following expression.

Mixed potential difference (mV)=mixed potential of electroless copper (mV vs. Ag/AgCl)−mixed potential of electrolytic copper (mV vs. Ag/AgCl)

The mixed potential of the electroless copper was 125 mV (vs. Ag/AgCl), whereas the mixed potential of the electrolytic copper was 120 mV (vs. Ag/AgCl). The mixed potential difference was 5 mV.

Measurement Example 7

The pre-etching treatment liquid composition (A4 liquid) and an etching liquid composition (B2 liquid) shown in Table 3 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B2 liquid was prepared by mixing 2.33 g of 60% hydrogen peroxide solution, 9.13 g of 46% aqueous solution of sulfuric acid, 0.01 g of 1,5-dimethyltetrazole, and 9.82 g of copper sulfate pentahydrate, and adding ultrapure water for the remaining part so that the total amount would be 100 g. The content of each component shown in Table 3 is the ratio by mass of each component with respect to the total mass of the pre-etching treatment liquid composition or the etching liquid composition.

A substrate including a resin and only electroless copper stacked on a surface of the resin, and a substrate including a resin and only electrolytic copper stacked on a surface of the resin, were each immersed in the A4 liquid (pre-etching treatment liquid composition) for 20 seconds. Etching was performed as follows with the B2 liquid (etching liquid composition) set to of 30° C. The substrate having only the electroless copper stacked thereon was immersed in the B2 liquid for 10 seconds, and the substrate having only the electrolytic copper stacked thereon was immersed in the B2 liquid for 90 seconds. Based on the pre-etching mass and the post-etching mass of each substrate, the etching amount was calculated by the following expression.

Etching amount (μm)=(pre-etching mass (g)−post-etching mass (g))÷area of the substrate (cm²)÷density of copper (8.94 g/cm³)

The resultant etching amount was divided by the treating time duration to calculate the etching rate. The etching rate of the electroless copper was 1.44 μm/min., whereas the etching rate of the electrolytic copper was 0.86 μm/min. The etching rate ratio of the electroless copper to the electrolytic copper was 1.7.

Comparative Example 1

The etching liquid composition (B1 liquid) shown in Table 4 was prepared. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 4 is the ratio by mass of each component with respect to the total mass of the etching liquid composition.

On a surface of a resin, a seed layer having an average thickness of 1.0 µm (maximum thickness: 1.2 µm; minimum thickness: 0.7 µm) was formed by electroless copper plating. Then, a wiring pattern having a thickness of 12 µm and a line/space of 6.0 µm/6.0 µm was formed by electrolytic plating. Thus, a stacking substrate was obtained. The etching liquid was sprayed to the stacking substrate by use of a spray etching machine at a spray pressure of 0.1 MPa and a treating temperature of 30° C. for a time duration 1.5 times the time duration required to eliminate the seed layer (30 seconds) (namely, the etching liquid composition was sprayed for 45 seconds). Side etching was evaluated by use of the scanning electron microscope (SEM: S3400 (trademark) manufactured by Hitachi High-Technologies Corporation) (see FIG. 15).

Figure 15:
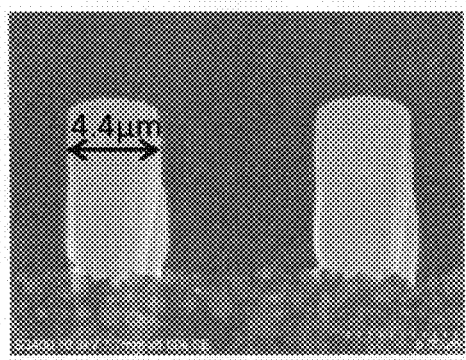
FIG. 15 shows an SEM image of a post-etching wiring pattern (Comparative example 1).

As shown in FIG. 15, in the case where the pre-etching treatment liquid composition is not used, the electrolytic copper has a width of 4.4 µm, and the amount of side etching continued for a time duration 1.5 times the time duration required to eliminate the seed layer (30 seconds) (namely, side etching continued for 45 seconds) was 0.80 µm on one side.

Comparative Example 2

The pre-etching treatment liquid composition (A4 liquid) and the etching liquid composition (B1 liquid) shown in Table 4 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B1 liquid was prepared by mixing 2.33 g of 60% hydrogen peroxide solution, 9.13 g of 46% aqueous solution of sulfuric acid, 0.01 g of 1,5-dimethyltetrazole, 1.0 g of 0.0165% aqueous solution of sodium chloride and 9.82 g of copper sulfate pentahydrate, and adding ultrapure water for the remaining part so that the total amount would be 100 g. The content of each component shown in Table 4 is the ratio by mass of each component with respect to the total mass of the pre-etching treatment liquid composition or the etching liquid composition.

On a surface of a resin, a seed layer having an average thickness of 1.0 µm (maximum thickness: 1.2 µm; minimum thickness: 0.7 µm) was formed by electroless copper plating. Then, a wiring pattern having a thickness of 12 µm and a line/space of 6.0 µm/6.0 µm was formed by electrolytic plating. Thus, a stacking substrate was obtained. The obtained stacking substrate was immersed in the A4 liquid (pre-etching treatment liquid composition) for 20 seconds, and then washed with water and dried. The etching liquid was sprayed to the stacking substrate by use of a spray etching machine at a spray pressure of 0.1 MPa and a treating temperature of 30° C. for a time duration 1.5 times the time duration required to eliminate the seed layer (28 seconds) (namely, the etching liquid composition was sprayed for 42 seconds). Side etching was evaluated by use of the scanning electron microscope (SEM: S3400 (trademark) manufactured by Hitachi High-Technologies Corporation) (see FIG. 16).

Figure 16:
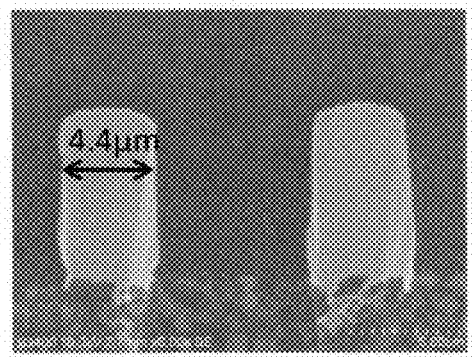
FIG. 16 shows an SEM image of a post-etching wiring pattern (Comparative example 2).

As shown in FIG. 16, in the case where the substrate is treated with a pre-etching treatment liquid composition and then washed with water and dried, the electrolytic copper has a width of 4.4 µm, and the amount of side etching continued for a time duration 1.5 times the time duration required to eliminate the seed layer (28 seconds) (namely, side etching continued for 42 seconds) was 0.80 µm on one side.

Comparative Example 3

The pre-etching treatment liquid composition (A4 liquid) and the etching liquid composition (B2 liquid) shown in Table 4 were prepared. The A4 liquid was prepared by adding 0.5 g of 0.0165% aqueous solution of sodium chloride (chloride ions: 0.5 ppm) to 99.5 g of 5% aqueous solution of sulfuric acid so that the total weight would be 100 g. The B2 liquid was prepared by mixing 2.33 g of 60% hydrogen peroxide solution, 9.13 g of 46% aqueous solution of sulfuric acid, 0.01 g of 1,5-dimethyltetrazole and 9.82 g of copper sulfate pentahydrate, and adding ultrapure water for the remaining part so that the total amount would be 100 g. The content of each component shown in Table 4 is the ratio by mass of each component with respect to the total mass of the pre-etching treatment liquid composition or the etching liquid composition.

On a surface of a resin, a seed layer having an average thickness of 1.0 µm (maximum thickness: 1.2 µm; minimum thickness: 0.7 µm) was formed by electroless copper plating. Then, a wiring pattern having a thickness of 12 µm and a line/space of 6.0 µm/6.0 µm was formed by electrolytic plating. Thus, a stacking substrate was obtained. The obtained stacking substrate was immersed in the A4 liquid (pre-etching treatment liquid composition) for 20 seconds. Continuously, the etching liquid composition (B2 liquid) was sprayed to the stacking substrate by use of a spray etching machine at a spray pressure of 0.1 MPa and a treating temperature of 30° C. for a time duration 1.5 times the time duration required to eliminate the seed layer (42 seconds) (namely, the etching liquid composition was sprayed for 63 seconds). Side etching was evaluated by use of the scanning electron microscope (SEM: S3400 (trademark) manufactured by Hitachi High-Technologies Corporation) (see FIG. 17).

Figure 17:
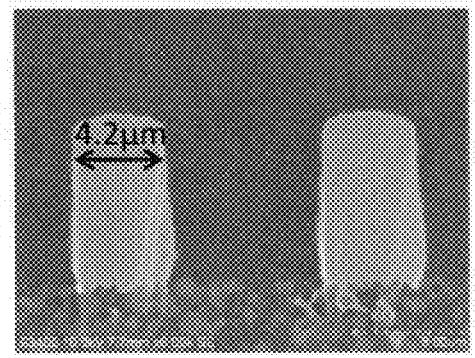
FIG. 17 shows an SEM image of a post-etching wiring pattern (Comparative example 3).

As shown in FIG. 17, in the case where the pre-etching treatment liquid composition is used but the etching liquid does not contain chloride ions, the electrolytic copper has a width of 4.2 µm, and the amount of side etching continued for a time duration 1.5 times the time duration required to eliminate the seed layer (42 seconds) (namely, side etching continued for 63 seconds) was 0.90 µm on one side.

According to the method of treating the wiring substrate by use of the pre-etching treatment liquid composition and the etching liquid composition described above, side etching of the wiring pattern (electrolytic copper) can be suppressed and thus the high density wiring substrate can be manufactured.

The present invention provides an industrially important technology of forming precise wires on a printed circuit substrate, and is applicable to form various types of wires such as wires on a glass substrate, wires on a surface of a plastic substrate, wires on a surface of a semiconductor substrate and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

TABLE 1

| MEASUREMENT EXAMPLE | PRE-ETCHING TREATMENT LIQUID COMPOSITION | PRE-ETCHING TREATMENT TIME (SEC) | ETCHING LIQUID COMPOSITION | | ETCHING RATE OF ELECTROLESS COPPER (µm/min) | ETCHING RATE OF ELECTROLYTIC COPPER (µm/min) | ETCHING RATE RATIO | MIXED POTENTIAL DIFFERENCE (mV) |
|---|---|---|---|---|---|---|---|---|
| 1 | A1 LIQUID HYDROCHLORIC ACID 0.000463% BY MASS (CHLORIDE IONS: ABOUT 4.5 ppm) | 30 | B1 LIQUID HYDROGEN PEROXIDE SULFURIC ACID 1,5-DIMETHYLTETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.21 | 0.16 | 7.6 | 70 |
| 2 | A2 LIQUID SULFURIC ACID 5.0% BY MASS SODIUM CHLORIDE 0.000033% BY MASS (CHLORIDE IONS: ABOUT 0.2 ppm) | 30 | B1 LIQUID HYDROGEN PEROXIDE SULFURIC ACID 1,5-DIMETHYLTETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.91 | 0.26 | 7.3 | 50 |
| 3 | A3 LIQUID SULFURIC ACID 5.0% BY MASS SODIUM CHLORIDE 0.0000165% BY MASS (CHLORIDE IONS: ABOUT 0.1 ppm) | 60 | B1 LIQUID HYDROGEN PEROXIDE SULFURIC ACID 1,5-DIMETHYLTETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.26 | 0.19 | 6.6 | 60 |
| 4 | A4 LIQUID SULFURIC ACID 5.0% BY MASS SODIUM CHLORIDE 0.0000825% BY MASS (CHLORIDE IONS: ABOUT 0.5 ppm) | 10 | B1 LIQUID HYDROGEN PEROXIDE SULFURIC ACID 1,5-DIMETHYLTETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.40 | 0.26 | 5.4 | 60 |

TABLE 2

| EXAMPLE | PRE-ETCHING TREATMENT LIQUID COMPOSITION | PRE-ETCHING TREATMENT TIME (SEC) | ETCHING LIQUID COMPOSITION | | ETCHING RATE OF ELECTROLESS COPPER (µm/min) | ETCHING RATE OF ELECTROLYTIC COPPER (µm/min) | ETCHING RATE RATIO | AMOUNT OF SIDE ETCHING (ONE SIDE) (µm) |
|---|---|---|---|---|---|---|---|---|
| 1 | A5 LIQUID HYDROCHLORIC ACID 0.000412% BY MASS (CHLORIDE IONS: ABOUT 4.0 ppm) | 90 | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.17 | 0.21 | 5.6 | 0.4 |
| 2 | A4 LIQUID SULFURIC ACID 5.0% BY MASS SODIUM CHLORIDE 0.0000825% BY MASS (CHLORIDE IONS: ABOUT 0.5 ppm) | 20 | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.14 | 0.25 | 4.6 | 0.45 |

TABLE 3

| MEASUREMENT EXAMPLE | PRE-ETCHING TREATMENT LIQUID COMPOSITION | PRE-ETCHING TREATMENT TIME (SEC) | ETCHING LIQUID COMPOSITION | | ETCHING RATE OF ELECTROLESS COPPER (μm/min) | ETCHING RATE OF ELECTROLYTIC COPPER (μm/min) | ETCHING RATE RATIO | MIXED POTENTIAL DIFFERENCE (mV) |
|---|---|---|---|---|---|---|---|---|
| 5 | — | — | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1ppm) | 1.4% BY MASS 4.2% BY MASS 0.01% BY MASS 25 g/L 0.000165% BY MASS | 1.98 | 1.00 | 2.0 | 5 |
| 6 | A4 LIQUID SULFURIC ACID 5.0% BY MASS SODIUM CHLORIDE 0.0000825% BY MASS (CHLORIDE IONS: ABOUT 0.5 ppm) | 20 | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 2.12 | 1.14 | 1.9 | 5 |
| 7 | A4 LIQUID SULFURIC ACID 5.0% BY MASS SODIUM CHLORIDE 0.0000825% BY MASS (CHLORIDE IONS: ABOUT 0.5 ppm) | 20 | B2 LIQUID HYDROGEN PEROXIDE SULFURIC ACID 1,5-DIMETHYL-TETRAZOLE COPPER IONS | 1.4% BY MASS 4.2% BY MASS 0.01% BY MASS 25 g/L | 1.44 | 0.86 | 1.7 | — |

TABLE 4

| COMPARATIVE EXAMPLE | PRE-ETCHING TREATMENT LIQUID COMPOSITION | PRE-ETCHING TREATMENT TIME (SEC) | ETCHING LIQUID COMPOSITION | | ETCHING RATE OF ELECTROLESS COPPER (μm/min) | ETCHING RATE OF ELECTROLYTIC COPPER (μm/min) | ETCHING RATE RATIO | AMOUNT OF SIDE ETCHING (ONE SIDE) (μm) |
|---|---|---|---|---|---|---|---|---|
| 1 | — | — | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 1.98 | 1.00 | 2.0 | 0.8 |
| 2 | A4 LIQUID SULFURIC ACID 5.0% BY MASS SODIUM CHLORIDE 0.0000825% BY MASS (CHLORIDE IONS: ABOUT 0.5 ppm) | 20 | B1 LIQUID HYDROGEN PEROXIDE SULFURIC ACID 1,5-DIMETHYL-TETRAZOLE COPPER IONS SODIUM CHLORIDE (CHLORIDE IONS: ABOUT 1 ppm) | 1.4% BY MASS 4.2% BY MASS 0.01% BY MASS 25 g/L 0.000165% BY MASS | 2.12 | 1.14 | 1.9 | 0.8 |

TABLE 4-continued

| COMPARATIVE EXAMPLE | PRE-ETCHING TREATMENT LIQUID COMPOSITION | PRE-ETCHING TREATMENT TIME (SEC) | ETCHING LIQUID COMPOSITION | | ETCHING RATE OF ELECTROLESS COPPER (μm/min) | ETCHING RATE OF ELECTROLYTIC COPPER (μm/min) | ETCHING RATE RATIO | AMOUNT OF SIDE ETCHING (ONE SIDE) (μm) |
|---|---|---|---|---|---|---|---|---|
| 3 | A4 LIQUID SULFURIC ACID 5.0% BY MASS SODIUM CHLORIDE 0.0000825% BY MASS (CHLORIDE IONS: ABOUT 0.5 ppm) | 20 | B2 LIQUID HYDROGEN PEROXIDE SULFURIC ACID 1,5-DIMETHYL-TETRAZOLE COPPER IONS | 1.4% BY MASS 4.2% BY MASS 0.01% BY MASS 25 g/L | 1.44 | 0.86 | 1.7 | 0.9 |

The invention claimed is:

1. A method of treating a wiring substrate in a semi-additive process, the method comprising:
   (1) contacting the wiring substrate with a pre-etching treatment liquid composition containing (a) a chloride ion and (b) a water, the wiring substrate containing a seed layer formed of an electroless copper and a wiring pattern formed of an electrolytic copper; and
   (2) continuously, etching the wiring substrate with an etching liquid composition containing (c) a hydrogen peroxide, (d) a sulfuric acid, (e) a tetrazole, (f) a chloride ion, (g) a copper ion and (h) a water.

2. The method according to claim 1, wherein the (a) chloride ion is contained in the pre-etching treatment liquid composition at a concentration of 1 to 10 ppm.

3. The method according to claim 1, wherein the (a) chloride ion is generated from at least one compound selected from sodium chloride, ammonium chloride, potassium chloride and hydrochloric acid.

4. The method according to claim 1, wherein in the step (2) in which the wiring substrate is treated with the etching liquid composition, a ratio (ERN/ERE) of an etching rate of the electroless copper (ERN) to an etching rate of the electrolytic copper (ERE) is 2.1 to 50.

5. The method according to claim 1, wherein a difference between a mixed potential of the electroless copper which forms the seed layer and a mixed potential of the electrolytic copper which forms the wiring pattern is 10 to 200 mV.

6. The method according to claim 1, wherein the (e) tetrazole is at least one compound selected from 1-methyltetrazole, 5-ethyl-1-methyltetrazole, 1-ethyl-5-methyltetrazole, 1,5-diethyltetrazole, 1-isopropyl-5-methyltetrazole, and 1,5-dimethyltetrazole.

7. A method of treating a wiring substrate in a semi-additive process, comprising:
   (1) contacting the wiring substrate with a pre-etching treatment liquid composition containing (i) a chloride ion, (j) a sulfuric acid and (k) a water, the wiring substrate containing a seed layer formed of an electroless copper and a wiring pattern formed of an electrolytic copper; and
   (2) continuously, etching the wiring substrate with an etching liquid composition containing (l) a hydrogen peroxide, (m) a sulfuric acid, (n) a tetrazole, (p) a chloride ion, (q) a copper ion and (r) a water.

8. The method according to claim 7, wherein in the pre-etching treatment liquid composition, the (i) chloride ion is contained at a concentration of 0.01 to 3 ppm and the (m) sulfuric acid is contained at a concentration of 1 to 20% by mass.

9. The method according to claim 7, wherein the (i) chloride ion is generated from at least one compound selected from sodium chloride, ammonium chloride, potassium chloride and hydrochloric acid.

10. The method according to claim 7, wherein in the step (2) in which the wiring substrate is treated with the etching liquid composition, a ratio (ERN/ERE) of an etching rate of the electroless copper (ERN) to an etching rate of the electrolytic copper (ERE) is 2.1 to 50.

11. The method according to claim 7, wherein a difference between a mixed potential of the electroless copper which forms the seed layer and a mixed potential of the electrolytic copper which forms the wiring pattern is 10 to 200 mV.

12. The method according to claim 7, wherein the (n) tetrazole is at least one compound selected from 1-methyltetrazole, 5-ethyl-1-methyltetrazole, 1-ethyl-5-methyltetrazole, 1,5-diethyltetrazole, 1-isopropyl-5-methyltetrazole, and 1,5-dimethyltetrazole.

13. A method of manufacturing a wiring substrate, comprising the method of treating the wiring substrate according to claim 1.

14. A method of manufacturing a wiring substrate, comprising the method of treating the wiring substrate according to claim 7.

* * * * *